United States Patent [19]

Brady et al.

[11] Patent Number: 5,757,503

[45] Date of Patent: May 26, 1998

[54] METHOD AND APPARATUS FOR FABRICATING PRODUCTS USING ALIGNMENT MEASURING TECHNIQUE

[75] Inventors: Michael Francis Brady, Morrisville; Hung Ngoc Nguyen, Bensalem, both of Pa.

[73] Assignee: Lucent Technologies Inc., Murray Hill, N.J.

[21] Appl. No.: 579,617

[22] Filed: Dec. 26, 1995

[51] Int. Cl.$^6$ ............................................. G01B 11/00
[52] U.S. Cl. ............................................. 356/400; 250/559.3
[58] Field of Search ..................................... 356/399–401; 250/559.3, 548; 355/43, 53; 348/92–95

[56] References Cited

U.S. PATENT DOCUMENTS

| | | | |
|---|---|---|---|
| 4,376,584 | 3/1983 | Hart et al. | 356/401 |
| 4,407,933 | 10/1983 | Fraser et al. | |
| 4,614,433 | 9/1986 | Feldman et al. | 356/401 |
| 4,623,257 | 11/1986 | Feather | 356/401 |
| 4,755,053 | 7/1988 | Levinson et al. | 356/400 |
| 4,904,087 | 2/1990 | Harvey et al. | 356/400 |
| 4,992,394 | 2/1991 | Kostelak, Jr. et al. | |
| 5,152,055 | 10/1992 | L'Esperance, III et al. | |
| 5,194,948 | 3/1993 | L'Esperance, III et al. | |
| 5,383,118 | 1/1995 | Nguyen | |

OTHER PUBLICATIONS

McCormick et al. "A Free Space .I. . Demonstration" SPIE vol. 1396 Applications Optical Engineering Proc. 1990.
Novotny et al. "Two Dimensional Fiber . . . Detector" Proc. SPIE vol. 1359. 1990.
Hatada et al. "A New LSI Technology . . . Bonding Technology" IEEE Electronic Compents Conf., 1989.
Hatada et al. "Micron Bump . . . Technology." Int'l Soc. for Hybrid Microelectronic Proc., 1989.

*Primary Examiner*—K. Hantis
*Attorney, Agent, or Firm*—Katharyn E. Olson

[57] ABSTRACT

A method and apparatus measures a deviation in alignment between two components of a product wherein each component is characterized by a respective pattern and wherein each pattern comprises respective elements. The centroid of each element in each respective pattern is indicated, and based on the centroid indications, the center of each respective pattern is indicated. The deviation in alignment between the two components is determined as a function of the indicated position of the centers of the respective patterns, and positioning of the components is controlled as a function of the indicated position of the centers of the respective patterns.

12 Claims, 6 Drawing Sheets

METHOD AND APPARATUS FOR FABRICATING PRODUCTS USING ALIGNMENT MEASURING TECHNIQUE

TECHNICAL FIELD

The invention relates to the field of equipment and processes for aligning components and to the field of products produced by aligning equipment and processes.

BACKGROUND OF THE INVENTION

Manufacturing processes, such as those in the integrated circuits and optical devices industries, often require accurate alignment of components in a product or device. Accurate alignment is typically necessary to ensure satisfactory operation of the product. For example, in processes used in the optical devices industry, a device component comprising a laser may have to be accurately aligned on a substrate relative to one or more other device components (such as a lens) on the substrate so as to ensure that light emitted from the laser is properly focused and directed.

Another example of a process in which accurate alignment is required is in the flip-chip bonding process used in advanced semiconductor and photonic packaging. Flip-chip bonding is used to assemble integrated circuits onto an interconnection substrate typically using solder as both the attachment and interconnection medium. In flip-chip bonding, metalization pads on the chips and substrates are fabricated with solder bumps that are shaped, for example, as oblate spheroids that typically can measure approximately 10 microns across the equatorial diameter of the bumps, 5 microns between the poles of the bumps and where the bumps are spaced as close as 20 microns apart. K. Hatada et al., "Micron Bump Bonding Assembly Technology," *Int'l Soc. for Hybrid Microelectronics Proc.*, 1989; K. Hatada and H. Fujimoto, "A New LSI Technology 'Micron Bump Bonding Technology'," *IEEE Electronic Components Conf.*, 1989. The bumps on the chip and the bumps on the substrate must be accurately aligned so as to ensure proper interconnection between the integrated circuit and the substrate.

A final example of a process in which accurate alignment is required is in technologies used in the free space optical connection area. Because this area offers the potential for large numbers of interconnections and high temporal bandwidth, free space interconnect schemes are being considered for large scale integration systems and photonic switching systems. See, F. B. McCormick et al., "A Free Space Cascaded Optical Logic Demonstration," in *Applications of Optical Engineering: Proceedings of OE/Midwest '90, SPIE*, vol. 1936, 1990; R. A. Novotny et al., "Two-dimensional Fiber Optical Data Link Using Self-electooptic Effect Device Modulators and OEIC Detectors," *Proc. SPIE*, vol. 1359, 1990. Increasingly, array surface active devices such as Self Electro-optic Effect Devices (SEEDs) and Surface Emitting Lasers (SELs) are being considered for these interconnection schemes. These systems require a method of collecting individual optical signals and imaging them for further processing. The optical signals are, for example, imaged onto the windows of a symmetric SEED which performs the switching functions on the signal. A typical dimension of the window of a SEED is 5×5 microns, and the optics which transmit the optical signals may comprise elements such as microlens arrays, bulk optics and planar optics. Proper system operation requires that alignment, in the micron to submicron region, be made between the optical elements (such as the microlenses) and the SEEDs.

Methods for aligning components and methods for measuring an alignment of components (e.g. after the components have been joined and bonded together) are typically manual or semi-automated. In either case, the alignment methods and alignment measurement methods often have several drawbacks. Many alignment methods employ the human eye and thus are typically slow and limited in accuracy. For example, the human eye may be used to read a vernier through an optical microscope to determine a deviation in alignment or overlap of features with resulting accuracy in the range of 1–2 microns. Such methods are further limited in accuracy because physical limits exist in making small features on components that can be detected manually. Another class of alignment techniques employ interferemetric systems which are capable of measuring alignment accuracy to the submicron level and are useful in aligning components during integrated circuit manufacturing processes. However, some interferemetric techniques require a large area on the components to be aligned so as to generate sufficiently accurate results. Other interferemetric systems, while not requiring large areas, typically require expensive laser and electronic equipment to measure the alignment.

Thus, automated techniques that accurately align components and efficiently measure alignments, independently of the human eye and of component features and without requiring expensive measuring equipment or large amounts of space on components, are desirable.

SUMMARY OF THE INVENTION

In accordance with the present invention a method and apparatus measure a deviation in alignment of a first component and a second component, the first component being characterized by a first pattern, the second component being characterized by a second pattern, based on quantities related to the positions of respective centers of the patterns. The first and second patterns each have respective elements. Quantities related to the positions of the centroids of the respective elements are determined and are then used to determine the quantities related to the positions of the respective centers of the patterns.

The apparatus comprises 1) a detector for receiving an image of the first pattern and the second pattern and 2) a vision system for determining a quantity related to the deviation in the alignment based on the image. The quantity related to the deviation is a function of quantities related to positions of respective centers of the first and second patterns. The vision system generates a signal as a function of the quantity related to the deviation. The quantity related to the position for the respective center of the first pattern is determined based on quantities related to the positions of centroids of elements characterizing the first pattern. The quantity related to the position for the respective center of the second pattern is determined based on quantities related to the positions of centroids of elements characterizing the second pattern.

The method first detects the first pattern and the second pattern and determines quantities related to the positions of the centroids of the elements in the respective patterns. The method determines both 1) a quantity related to a position for a respective center of the first pattern based on the quantities related to the positions of the centroids for the elements in the first pattern and 2) a quantity related to a position for a respective center of the second pattern based on the quantities related to the positions of the centroids for the elements in the second pattern. Based on the quantities related to the positions for the respective centers of the first and second patterns, the method determines a quantity related to the deviation in the alignment of the first component and the second component. The method generates a signal as a function of the quantity related to the deviation. The generated signal may be used to adjust the position of the first component relative to the second component.

The inventive method and apparatus can measure alignment accuracy to approximately 0.1 micron when the two components are separated by less than 5 microns. Alignment accuracy of approximately 0.2 microns is achieved when the separation between the two components is less than 30 microns.

DETAILED DESCRIPTION

The drawings are not to scale, with certain dimensions being distorted to aid in clarity of explanation. For illustrative purposes, the inventive method and apparatus will be illustrated in the context of manufacturing processes for fabrication of integrated circuit devices. However the inventive method and apparatus are not limited to such a context. For reference purposes, the "top" and "bottom" of a component are defined with respect to coordinate system 101 in FIG. 1. Coordinate system 101 comprises three orthogonal axes, labeled x, y and z, as shown. Specifically, the "top" portions of respective components have a z coordinate value that is either consistently larger or smaller than the z coordinate value of "bottom" portions of the respective components. For example, for illustrative purposes herein, the "top" of a respective component will have a larger z coordinate value than the "bottom" of the respective component.

Figure 1:
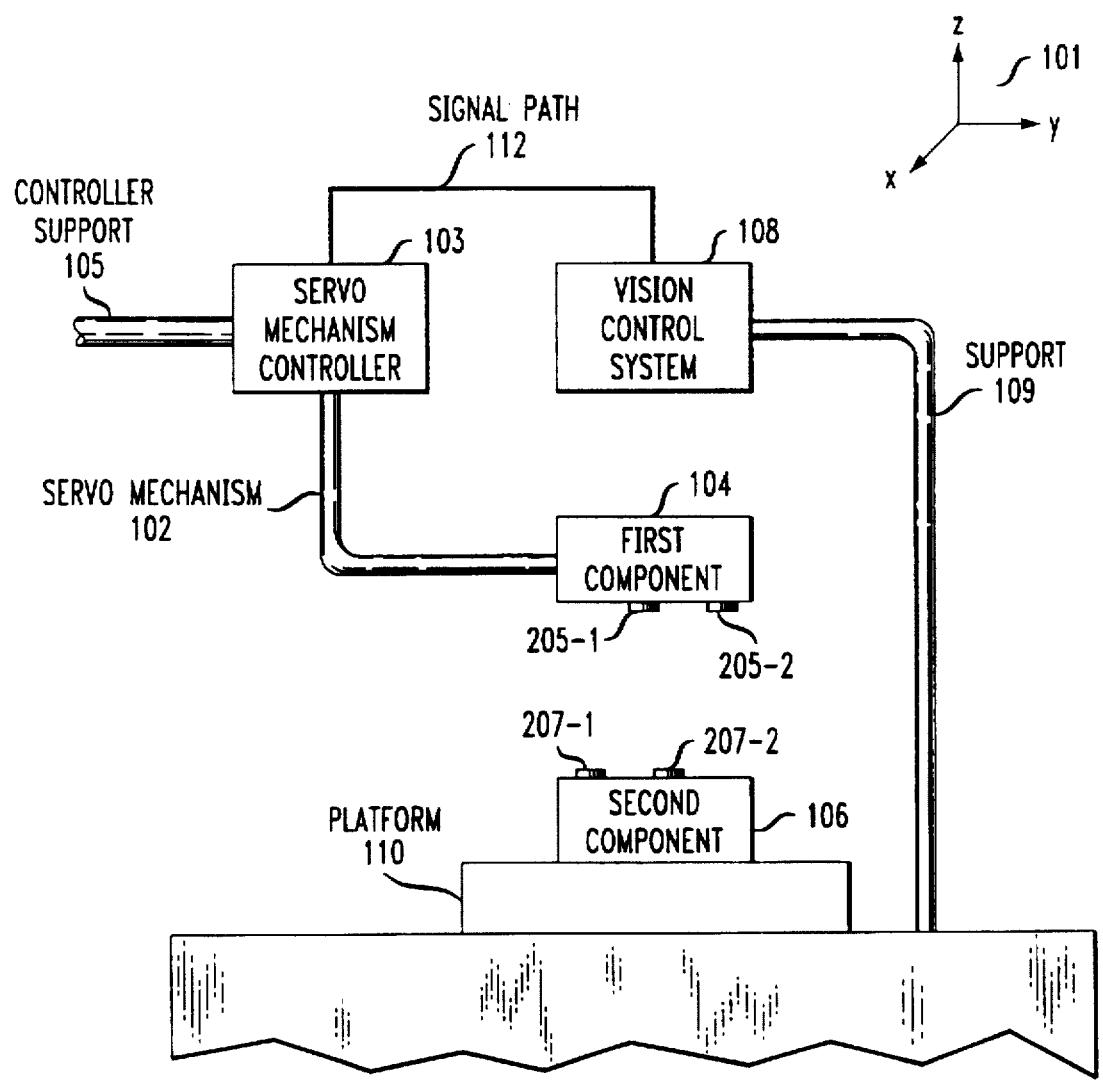
FIG. 1 illustrates an embodiment of the inventive apparatus and illustrates a system in which the inventive method may be practiced.

FIG. 1 illustrates a side view of an embodiment of the inventive apparatus for aligning and for measuring the alignment of components. For illustrative purposes, first component 104 comprises an array surface active device such as a SEED and second component 106 is a glass substrate comprising a microlens array.

Figure 2A:
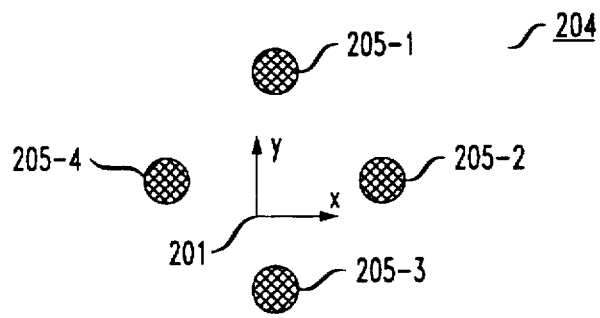
FIG. 2A illustrates features of a first pattern.

First component 104 features first pattern 204 (as shown in FIG. 2A), comprising a plurality of first elements 205-i, which pattern is useful in the inventive method. The example of first pattern 204 in FIG. 2A is a pattern in which the first elements 205-i are four circles or dots in a diamond arrangement. As shown in FIG. 2A the diamond arrangement of the four circles is such that each circle is located approximately equally distant from the origin of coordinate system 201 and where (assuming the positive x axis of coordinate system 201 is at an angle of 0°) the circles are located at 0°, 90°, 180° and 270°.

First pattern 204 advantageously is deposited or formed on the surface of first component 104 that faces second component 106 (i.e., to the bottom surface). First pattern 204 is advantageously formed using photolithography process steps which are capable of accurately forming first pattern 104. First pattern 204 is advantageously located on a portion of first component 104 that is not used for executing operations performed by first component 104, i.e. first pattern 204 is located in an inactive or unused region of first component 104. First elements 205-i are, for illustrative purposes, comprised of multiple layers of materials such as titanium, platinum and gold. Titanium is advantageously used as the bottom layer (i.e. the layer closest to the component) because it adheres well to materials, such as silicon, typically used in the components. Gold is advantageously used on the top layer to prevent oxidation and to reflect light incident on first elements 205-i. It is possible to use other materials for elements in the patterns depending on the materials comprising the components and on desired properties with respect to incident energy (e.g. that the material be transparent or opaque to light of specified wavelengths). The size and spacing of the elements is chosen based on the process used to form the elements, on the space available on the components and on the wavelength of the light used to detect the patterns (as discussed below). For example, first elements 205-i are approximately 50, ±1, microns in diameter each, and nearest elements in first pattern 204 are advantageously on the order of 100, ±1 microns apart. Using such pattern and element sizing, the inventive method and apparatus can measure alignment accuracy to approximately 0.1 micron when the two components are separated by less than 5 microns. Alignment accuracy of approximately 0.2 microns is achieved when the separation between the two components is less than 30 microns.

Figure 2B:
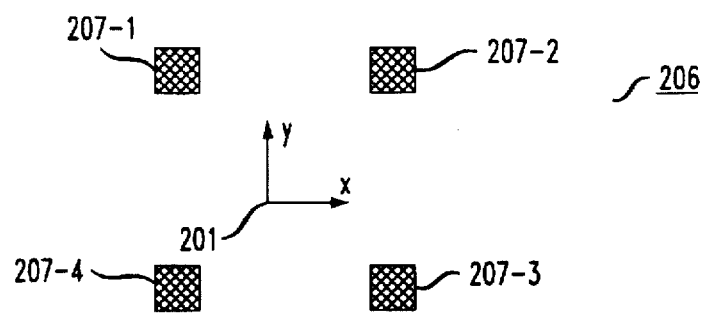
FIG. 2B illustrates features of a second pattern.

Second component 106 features second pattern 206. Second pattern 206, comprising a plurality of second elements 207-j, is advantageously formed or deposited on the surface of second component 106 that faces first component 104 (i.e., to the top surface). FIG. 2B illustrates an example of second pattern 206 useful in the inventive method. The example of second pattern 206 in FIG. 2B is pattern in which the second elements are four squares in a rectangular arrangement. As shown in FIG. 2B the rectangular arrangement of the four squares is such that each square is located approximately equally distant from the origin of coordinate system 201 as shown. The squares are located at 45°, 135°, 225° and 315°. Second pattern 206 is advantageously constructed by the photolithography process described above and is located in an used region of second component 106. Second elements 207-j are, for illustrative purposes, comprised of the same materials as first elements 205-i and are approximately of size 50 by 50 microns, and nearest elements in second pattern 206 are advantageously on the order of 100 microns apart.

Figure 4:
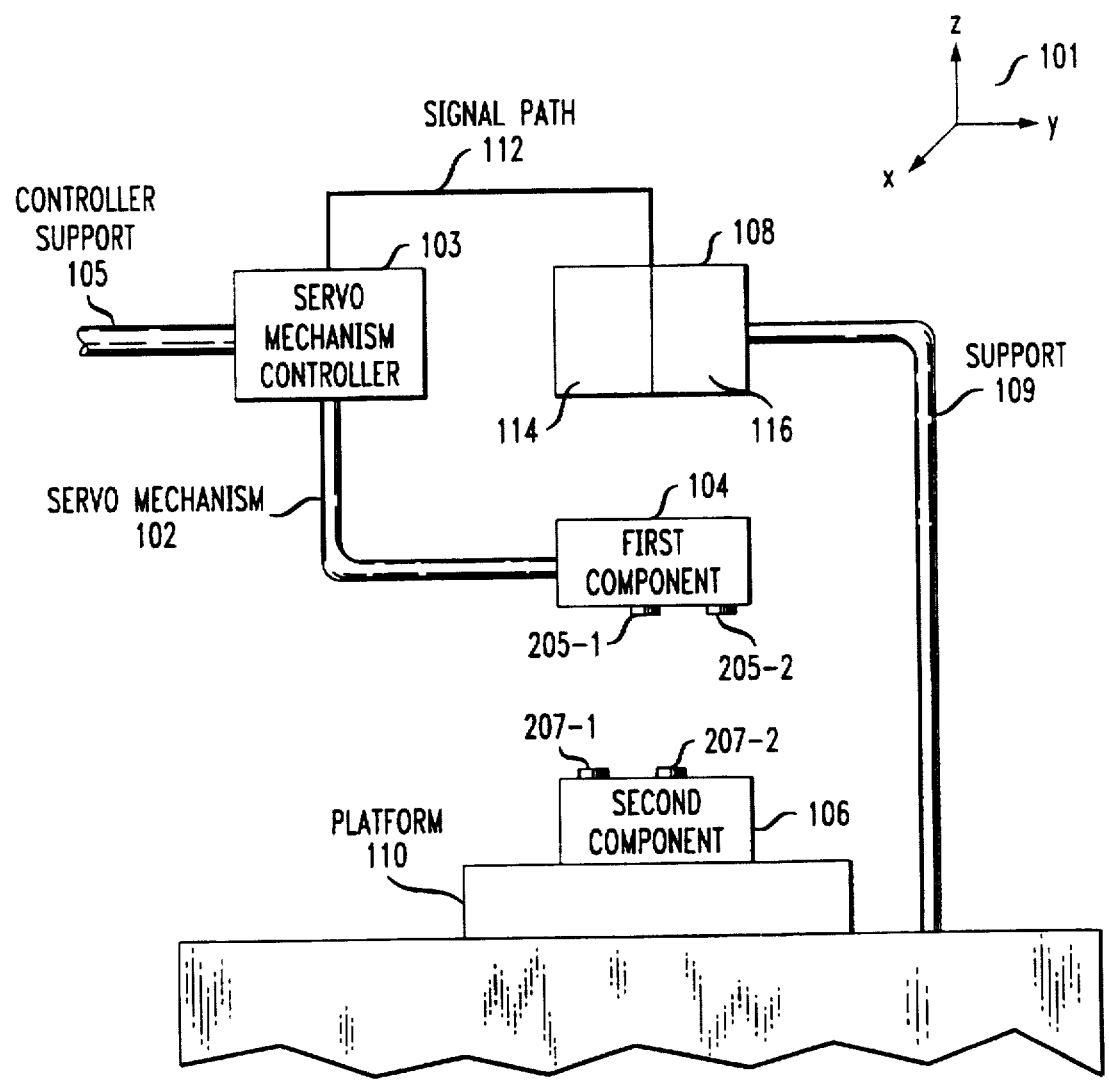
FIG. 4 illustrates the embodiment of FIG. 1 showing details of the vision control system.

Returning to FIG. 1, servo mechanism 102 is controlled by servo mechanism controller 103 (supported by controller support 105). Servo mechanism controller 103 directs servo mechanism 102 to place first component 104 in alignment with second component 106. It is possible to use servo mechanism 102 to join first component 104, with second component 106 together in response to signals from vision control system 108 received along signal path 112. Second component 106 advantageously remains stationary on platform 110. First component 104 and second component 106 are considered, for purposes of this invention, accurately aligned in the x and y directions if the centers of the respective patterns are positioned with respect to each other within a specified tolerance, illustratively herein that the centers of the patterns 206 and 205 coincide within a tolerance of ±5 microns. FIG. 4 shows another view of the inventive apparatus of FIG. 1. Vision control system 108 advantageously comprises a detector 114 and a vision system 116. The detector (such as a camera utilizing charge couple device technology) 114 converts an optical image into an electronic image for use by the vision system 116. The vision system 116 is advantageously a system such as the Cognex Vision System Model 3400 which system advantageously detects light at visible wavelengths. Servo mechanism 102 and servo controller 103 are advantageously servo systems such as those manufactured by New England Affiliated Technologies.

Figure 2C:
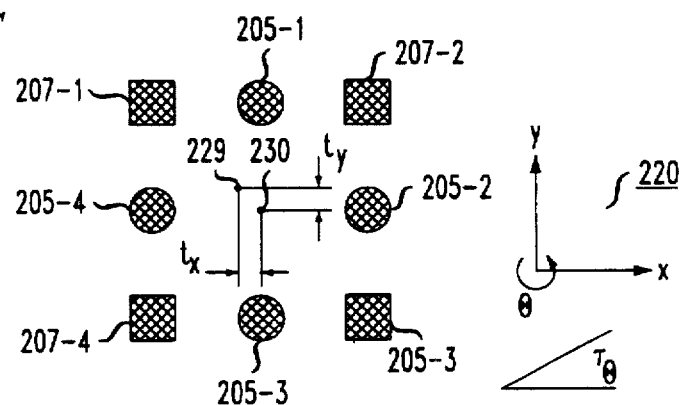
FIG. 2C illustrates a superposition of a first pattern and a second pattern.

As the first and second components 104 and 106, respectively, are brought together by servo mechanism 102, first pattern 204 and second pattern 206 will be, from a top view of the system in FIG. 1, detected by vision control system 108 which is supported by arm 109. One example of detected first pattern 204 and second pattern 206 is shown in FIG. 2C. Vision control system 108 advantageously detects first pattern 204 and second pattern 206 by suitable techniques such as by reflective imaging techniques or transmissive imaging techniques as described below, depending on the materials comprising first component 104, second component 106 and their respective patterns, 204 and 206. As the components are brought together, vision control system 108 monitors and analyzes detected first pattern 204 and second pattern 206.

The analysis of the detected patterns is advantageously based on a determination of, for each element 205-i in first pattern 204 and each element 207-j of second pattern 206, a respective quantity related to the position of the centroid of each respective element. The centroid of an element is the point whose coordinates are the mean values of the coordinates of all the points in the element. Note that each element 205-i in first pattern 204 and each element 207-j in second pattern 206 is a plane area. For a plane area such as an element in a pattern, the position of the centroid is given by a coordinate pair (x', y') where $$x' = \frac{\int\int_A x dS}{A} \text{ and } y' = \frac{\int\int_A y dS}{A}$$

where A is the area of the element and dS is the area of an infinitesimal portion of the element. Thus, the coordinate pair $(x_{k,l}, y_{k,l})$ may be used to indicate the position, in the $k^{th}$ pattern of the $l^{th}$ element in that pattern. The centroid may be determined analytically or numerically.

Based on the quantities related to the positions of the centroids of elements 205-i in first pattern 204, a quantity related to the location of the center of the first pattern is determined. In particular, the center of first pattern 204 is advantageously given by a coordinate pair $(x_{l,c}, y_{l,c})$ where $x_{l,c}$ is the average of the values of the x coordinates of the centroids of elements 205-i in first pattern 204 and where $Y_{l,c}$ is the average of the values of the y coordinates of the centroids of elements 205-i in first pattern 204. Similarly, a quantity related to the location of the center of second pattern 206 can be determined.

Based on the quantities related to the positions of the centers of the patterns, vision control system 108 generates signals to control the positioning of first component 104 by servo mechanism controller 103. In response to the signals, servo mechanism controller 103 causes servo mechanism 102 to move so as to reduce any deviation in alignment between the centers of the patterns.

Figure 2D:
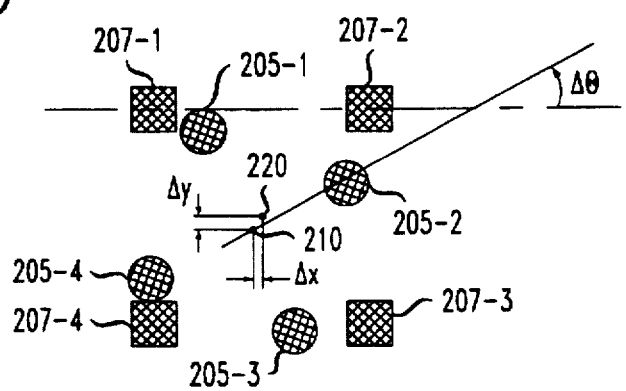
FIG. 2D illustrates another superposition of a first and second pattern.
Figure 3:
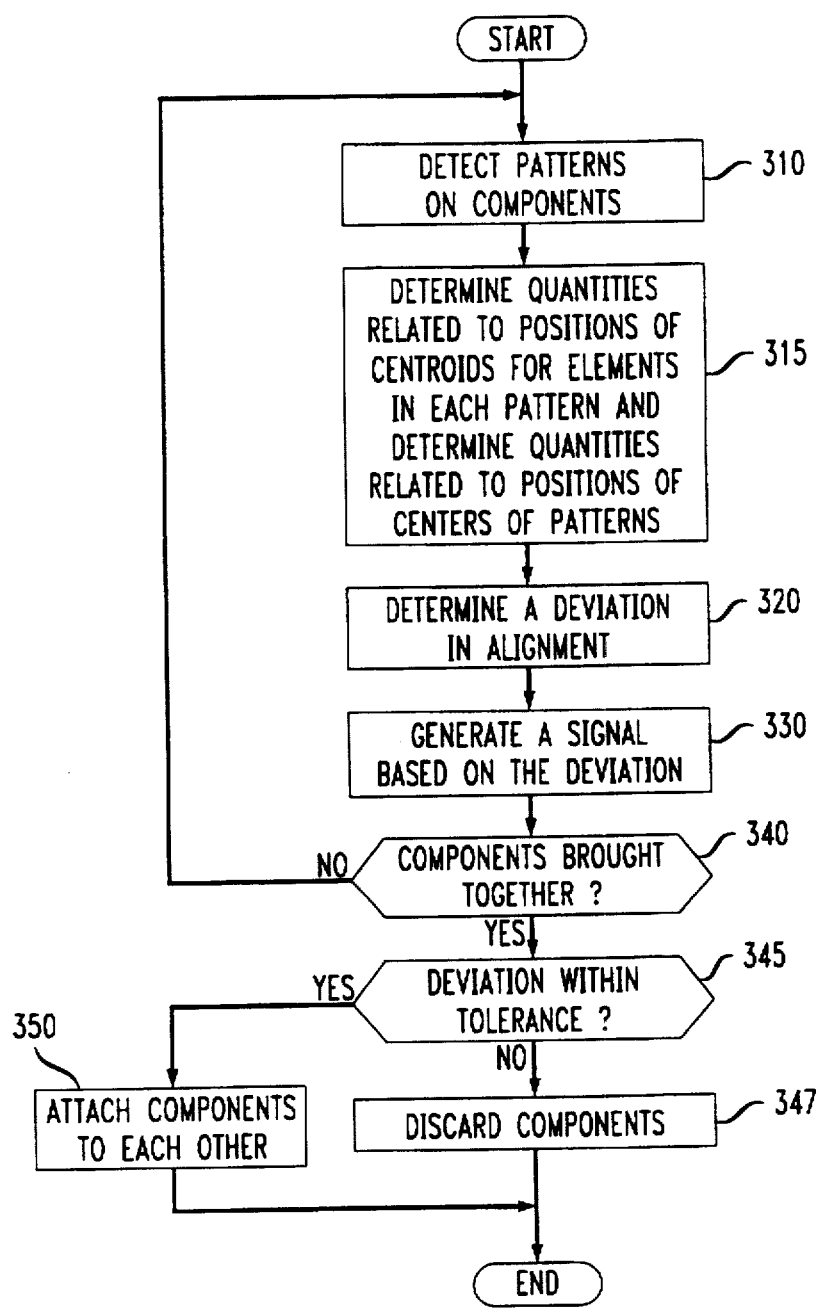
FIG. 3 is a flowchart of steps in the inventive method for aligning components and for measuring the alignment.

The system of FIG. 1 executes the following steps for measuring the alignment of components and for generating signals to control the alignment of components as illustrated in FIG. 3. In step 310, vision control system 108 first detects first pattern 204 and second pattern 206, such as shown in FIG. 2D. An axis, termed the θ axis is an axis perpendicular to the plane defined by coordinate system 220. The θ axis is an axis about which rotational adjustments between components are made.

In step 315 vision control system 108 determines for elements in each pattern 204 a respective quantity related to the position of centroid of the element. In step 315 a quantity related to the position of the center of each pattern is also determined (advantageously based on the quantities related to the positions of the centroids of the elements in each pattern). Referring to FIG. 2D, the center of first pattern 204 is located at coordinates specifying position 210. Intuitively, since first pattern 204 is symmetric, the center of first pattern 204 is located at the position midway between the four circles, i.e., at position 210. The center of second pattern 206 is also determined in step 315. A quantity related to the center of second pattern 206 is located at position 220.

In step 320 quantities related to the positions of the centers of the patterns are analyzed by vision control system 108 to determine the alignment by determining or measuring a deviation in alignment in the x and y directions. The distance or deviation in alignment between positions 210 and 220 is advantageously determined as a function of $\Delta x$ and $\Delta y$, representing the difference between positions 210 and 220 in the x and y directions, respectively. Thus, the quantities related to the positions of the centers of the patterns (i.e., the output of step 320) may be used to determine, or as a measure of, a deviation in alignment of the centers between first component 104 and second component 106. For example, the difference in the quantities related to the positions of the centers of the patterns may be used to determine a deviation.

Figure 2E:
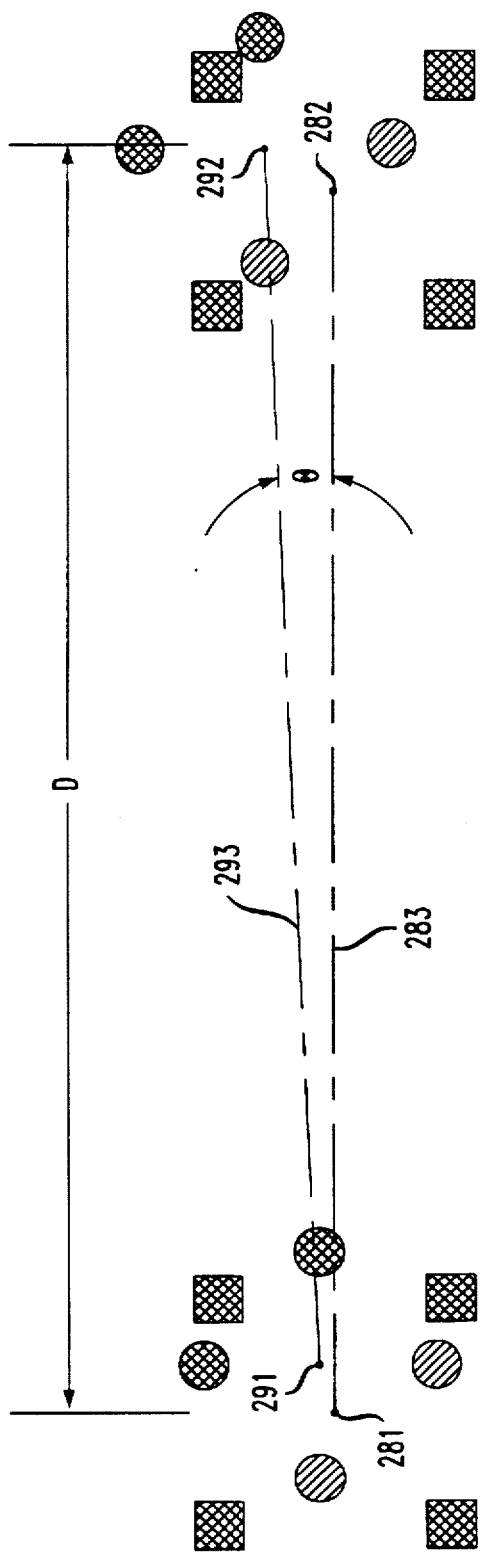
FIG. 2E illustrates another superposition useful for measuring a rotational deviation.

A deviation in alignment in the θ direction, $\Delta\theta$, may be calculated based on an angle formed by the intersection of two lines where one of the line runs through two elements in first pattern 204 and where the other line runs through two elements in second pattern 206. For example, as shown in FIG. 2D, $\Delta\theta$ is the acute angle formed by the intersection of first line 260 and second line 270, where first line 260 connects two elements in first pattern 204 and second line 270 connects two elements of second pattern 206. First line 260 connects elements 205-4 and 205-2 and second line 270 connects elements 207-1 and 207-2, and $\Delta\theta$ is indicated accordingly. The elements through which the lines advantageously are chosen so that both lines are as near to the vertical (i.e., to 90° as given by coordinate system 220) or to the horizontal vertical (i.e., to 0° as given by coordinate system 220) as possible. FIG. 2D illustrates a case where the lines are as horizontal as possible. Different elements may be chosen to define the intersecting lines with $\Delta\theta$ defined accordingly. Alternatively, $\Delta\theta$ may be calculated as shown in FIG. 2E. FIG. 2E illustrates the alignment to components. A respective pattern, such as first pattern 204, is applied to one of the components at two different locations separated by a distance D. The center of the respective pattern at each location is determined (points 281 and 282 in FIG. 2E) for the one component, and line 283 connecting the centers is determined. Likewise, the other component has a respective pattern, such as second pattern 206, applied to it at two different locations also separated by a distance D. The center of the respective pattern at each location is determined (points 291 and 292 in FIG. 2E) for the other component, and line 293 connecting the centers is determined. The deviation in the θ direction is then the angle between line 283 and 293. Better accuracy is achieved in this alternative method due to measurements over the increased distance D.

Based on the deviation as measured or determined in step 320, vision control system then in step 330 advantageously generates and sends a signal to servo mechanism controller 103 which then adjusts servo mechanism 102 in the x, y and θ directions so as to reduce the distance between positions 210 and 220. The signal is advantageously a function of the deviation. The above steps are advantageously repeated, as necessary, until the components are brought together (step 340). In step 345 the inventive method determines if the deviation is within specified tolerances thereby indicating satisfactory alignment of the components. For example, the positions of first pattern 204 and second pattern 206 in FIG. 2C indicate an alignment within specified tolerances since the centers of the patterns, located at points 229 and 230, are within tolerances ($t_x, t_y, t_θ$) specified for each dimension as shown in FIG. 2C. If the deviation is outside of specified tolerances, the components may be, for example, discarded (as in step 347) or the components can be separated and the process repeated until either the deviation is within tolerance or the number of attempts to align the components exceeds a particular value.

Thus, the inventive apparatus and method may be used to align components using respective patterns applied to each component to be aligned. It is possible to use the inventive method and apparatus to measure the alignment between components (either joined together or spaced apart) using respective patterns applied to each component to be aligned. Quantities related to the position of the center of each respective pattern are found. The alignment of the components is controlled as a function of the quantity related to the position of the centers of the respective patterns, and deviations in alignment are measured or determined as a function of the quantity related to position of the centers of the respective patterns. The inventive method and apparatus thus accurately and efficiently align components and determine the alignment of components independently of the human eye and of component features.

First component 104 and second component 106 are advantageously be attached or bonded together in step 350 as for example by activating a heater in platform 110 so as to cause material (e.g., solder) on the surfaces between the components to melt and then to solidify once the heater is deactivated. Once bonded, steps 310-330 may be repeated to determine the alignment of the bonded components.

Figure 5:
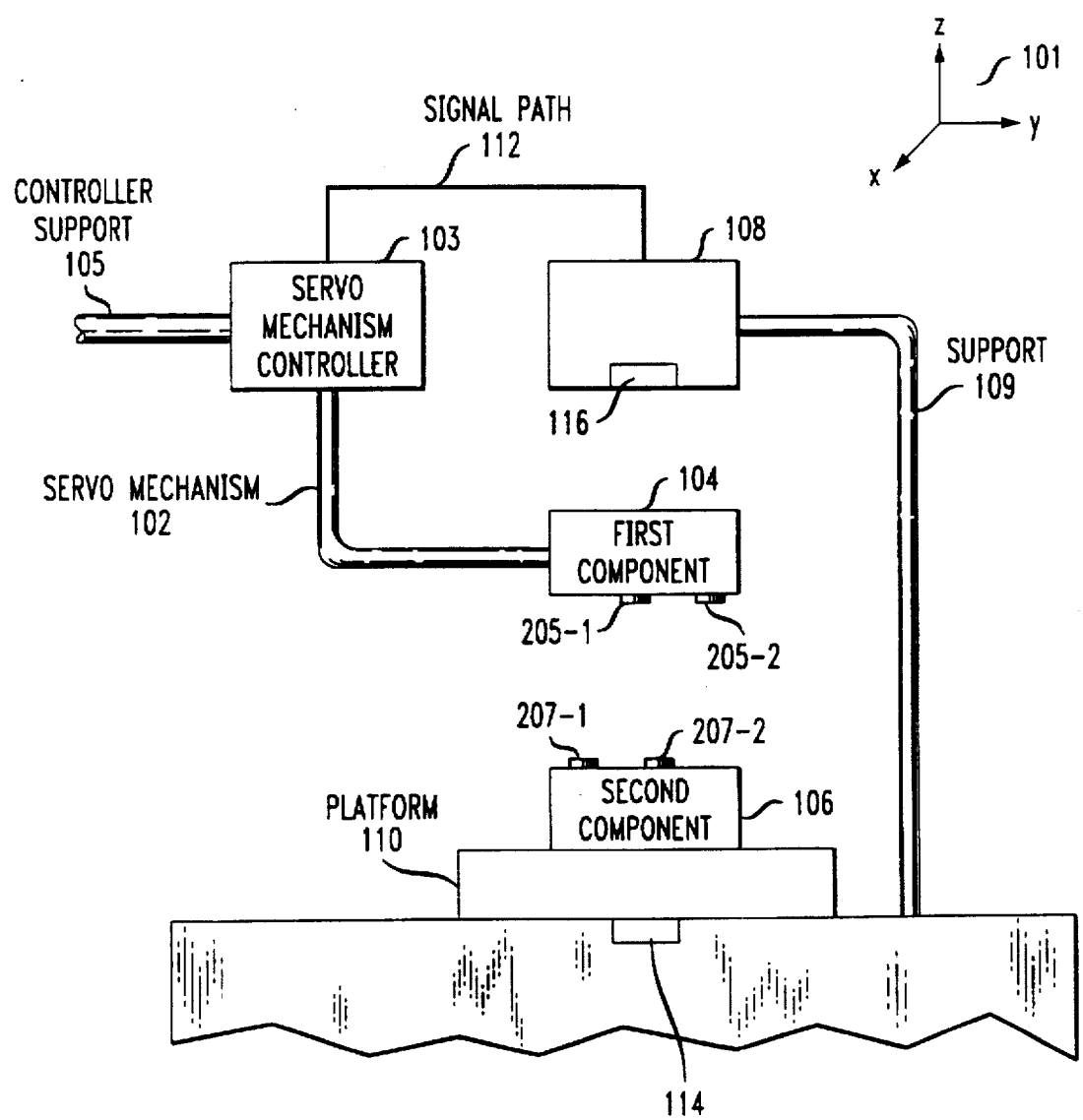
FIG. 5 illustrates the embodiment of FIG. 1 showing details of an alternate arrangement of the vision control system.

As noted above, vision control system 108 advantageously uses either reflective or transmissive imaging. Assume vision control system 108 emits light of specified wavelengths. Then the materials comprising the components and the patterns will reflect, transmit (i.e., be transparent to) or absorb (i.e., be opaque to) light incident from vision control system 108 in varying degrees depending on the materials. Reflective imaging would be useful, for example, if first component 104 comprised materials transparent to light emitted by vision control system 108, second component 106 comprised opaque or reflective material and the elements in the first and second patterns comprised reflective or opaque material. In such a case, light, emitted by vision control system 108 would be reflected back at the interface of first component 104 and second component to the detector 114, advantageously located in vision control system 108, and the detected patterns would be available for analysis. Alternatively, if first component 104 comprised transparent material, second component 106 comprised transparent material and the elements in first and second patterns comprised opaque or reflective material, transmissive imaging could advantageously be used. In such a case, light, emitted by vision control system 108 would penetrate both first component 104 and second component 106 and would be received at the detector 114 advantageously positioned below second component 106, as shown in FIG. 5, which detector would then convey signals, representing the detected patterns, to vision control system 108 for analysis. Note that in such a transmissive imaging scheme the position of the vision system 116 and detector 114 may be interchanged without affecting the scheme.

In selecting patterns to be applied to respective components, all that is necessary is that a vision control system be able to distinguish the respective patterns from each other. Patterns may be distinguished (i.e., all the elements in a given pattern may be identified and located and the center of the pattern determined from the identified and located elements), for example, based on one or more of the following: the shape of the elements, the patterns (e.g., circles versus squares), the arrangement of the elements within each pattern (e.g., diamond versus square), the spacing between elements in each pattern, the size of elements in a pattern (as for example in the case where the same shaped element is used in more than one pattern).

It should be noted that patterns may also be distinguished based on the material comprising elements in a pattern. For example, if two patterns are identical in shape and arrangement but with the elements in each pattern comprising a different material, the properties of the materials may be used to distinguish the two patterns. In particular, if light of a given wavelength is used by a vision system to detect the patterns, the different material in each pattern may reflect or transmit the light differently thereby resulting in a different intensity in light received at a detector for each material. The different intensity levels may then be used to identify which elements belong to each of the two patterns.

Although the inventive method and apparatus have been illustrated in the context of alignment of components used in the integrated circuits industry, those skilled in the art will recognize the applicability of these teachings to other specific contexts. For example, the inventive method and apparatus may be used with components of sizes larger than the size of components typically used in the integrated circuits industry. Further, extension of the inventive method, apparatus and product to more than two components is readily achieved. For example, the alignment of three components may be achieved by using three patterns (one for each component), determining quantities related to the position of the center of each pattern, and by adjusting the position of each component relative to the others based on the positions of the centers.

What is claimed is:

1. A method of measuring a deviation in an alignment of a first component and a second component, said first component being characterized by a first pattern, said second component being characterized by a second pattern, said first pattern comprising a first set of first elements and said second pattern comprising a second set of second elements, said method comprising the steps of:

detecting said first pattern and detecting said second pattern, for said first set of elements, determining a plurality of first quantities, one of the plurality of first quantities corresponding to one of the first elements and relating to a centroid for said one of the plurality of first elements in said first set of first elements, and for said second set of elements, determining a plurality of second quantities, one of the plurality of second quantities corresponding to one of the second elements and relating to a centroid for said one of the plurality of second elements in said second set of second elements, determining a third quantity related to a center of said first pattern based on the plurality of first quantities and determining a fourth quantity related to a center of said second pattern based on the plurality of second quantities, determining a fifth quantity related to said deviation in alignment of said first component and said second component based on said third quantity and said fourth quantity, and generating a signal as a function of said fifth quantity related to said deviation.

2. The method of claim 1 further comprising the step of adjusting a position of said first component with respect to said second component based on said signal.

3. The method of claim 1 wherein said deviation in alignment is in a first plane substantially parallel to a second plane intersecting all the first elements in said first set of first elements.

4. The method of claim 3 wherein said deviation in alignment is determined about an axis perpendicular to said first plane.

5. The method of claim 1 further comprising the step of bonding together said first and second components.

6. A product comprising a first component and a second component, said first component being characterized by a first pattern, said second component being characterized by a second pattern, said first pattern comprising a first set of first elements and said second pattern comprising a second set of second elements, said product produced by the process of:

detecting said first pattern and detecting said second pattern, for said first set of elements, determining a plurality of first quantities, one of the plurality of first quantities corresponding to one of the first elements and relating to a centroid for said one of the plurality of first elements in said first set of first elements, and for said second set of elements, determining a plurality of second quantities, one of the plurality of second quantities corresponding to one of the second elements and relating to a centroid for said one of the plurality of second elements in said second set of second elements, determining a third quantity related to a center of said first pattern based on the plurality of first quantities and determining a fourth quantity related to a center of said second pattern based on the plurality of second quantities, determining a fifth quantity related to said deviation in alignment of said first component and said second component based on said third quantity and said fourth quantity, generating a signal as a function of said fifth quantity related to said deviation, adjusting a position of said first component with respect to said second component based on said signal, and attaching said first component to said second component.

7. The process of claim 6 wherein said deviation in alignment is in a first plane substantially parallel to a second plane intersecting all the first elements in said first set of first elements and wherein said deviation is determined with respect to an axis perpendicular to said first plane.

8. A system for indicating a deviation in an alignment of a first component and a second component, said first component being characterized by a first pattern, said second component being characterized by a second pattern, said first pattern comprising a first set of first elements and said second pattern comprising a second set of second elements, said system comprising:

a detector, wherein said detector receives an image of said first pattern and said second pattern and produces an electronic image of said first and said second patterns; and a vision system connected to said detector, wherein said vision system receives said electronic image, and determines a deviation quantity related to said deviation in said alignment of said first component and of said second component based on said image as a function of first and second quantities related to first and second centers of said first and second patterns, wherein the first quantity related to the center of said first pattern is determined based on a first element centroid quantity related to centroids of the first elements in said first set of first elements, wherein the second quantity related to the center of said second pattern is determined based on a second element centroid quantity related to centroids of second elements in said second set of the second elements, and wherein said vision system generates a signal as a function of said deviation quantity related to said deviation.

9. The system of claim 8 further comprising a controller for adjusting a position of said first component with respect to said second component based on said signal.

10. The system of claim 8 further comprising a heater for attaching said first component to said second component.

11. The system of claim 8 wherein said image is generated by transmissive imaging.

12. The system of claim 8 wherein said image is generated by reflective imaging.

* * * * *